United States Patent [19]

Suzuki

[11] Patent Number: 5,631,773
[45] Date of Patent: May 20, 1997

[54] IMAGE PROJECTION METHOD AND SEMICONDUCTOR DEVICE MANUFACTURING METHOD USING THE SAME

[75] Inventor: Akiyoshi Suzuki, Tokyo, Japan

[73] Assignee: Canon Kabushiki Kaisha, Tokyo, Japan

[21] Appl. No.: 483,866

[22] Filed: Jun. 7, 1995

Related U.S. Application Data

[62] Division of Ser. No. 292,174, Aug. 18, 1994, abandoned, which is a continuation of Ser. No. 921,331, Jul. 29, 1992, abandoned.

[30] Foreign Application Priority Data

Aug. 2, 1991 [JP] Japan .................. 3-194132

[51] Int. Cl.$^6$ .................. G02B 5/18; G02B 27/46; G03B 27/42; G03B 27/54
[52] U.S. Cl. .................. 359/562; 359/558; 359/619; 355/53; 355/67
[58] Field of Search .................. 359/562, 564, 359/619; 355/53, 68, 71, 67; 362/32, 268

[56] References Cited

U.S. PATENT DOCUMENTS

| | | | |
|---|---|---|---|
| 3,771,872 | 11/1973 | Nightingale et al. | 355/125 |
| 3,795,446 | 3/1974 | Houston | 355/78 |
| 3,887,816 | 6/1975 | Colley | 250/571 |
| 4,159,164 | 6/1979 | Dammann et al. | 350/162 |
| 4,497,015 | 1/1985 | Konno et al. | 362/268 |
| 4,521,082 | 6/1985 | Suzuki et al. | 350/236 |
| 4,547,037 | 10/1985 | Case | 350/3.75 |
| 4,634,240 | 1/1987 | Suzuki et al. | 350/508 |
| 4,645,924 | 2/1987 | Suzuki et al. | 250/236 |
| 4,668,077 | 5/1987 | Tanak | 355/53 |
| 4,746,958 | 5/1988 | Yamakawa | 355/68 |
| 4,777,374 | 10/1988 | Nakata et al. | 250/548 |
| 4,780,747 | 10/1988 | Suzuki et al. | 355/53 |
| 4,799,791 | 1/1989 | Echizen et al. | 356/121 |
| 4,924,257 | 5/1990 | Jain | 355/53 |
| 4,931,830 | 6/1990 | Suwa et al. | 355/271 |
| 4,943,733 | 7/1990 | Mori et al. | 250/548 |
| 4,947,030 | 8/1990 | Takahashi | 250/201.1 |
| 4,947,413 | 8/1990 | Jewell et al. | 359/562 |
| 4,988,188 | 1/1991 | Ohta | 353/122 |
| 5,061,956 | 10/1991 | Takubo et al. | 355/55 |
| 5,067,811 | 11/1991 | Ouchi | 356/121 |
| 5,097,291 | 3/1992 | Suzuki | 355/53 |
| 5,121,160 | 6/1992 | Sano et al. | 355/53 |
| 5,144,362 | 9/1992 | Kamon et al. | 355/53 |
| 5,153,419 | 10/1992 | Takahashi | 250/201.1 |
| 5,160,962 | 11/1992 | Miura et al. | 355/68 |

(List continued on next page.)

FOREIGN PATENT DOCUMENTS

| | | |
|---|---|---|
| 0293643 | 12/1988 | European Pat. Off. . |
| 0346844 | 12/1989 | European Pat. Off. . |
| 0437376 | 7/1991 | European Pat. Off. . |
| 0486316 | 5/1992 | European Pat. Off. . |
| 1579159 | 7/1969 | France . |
| 2835363 | 3/1980 | Germany . |
| 3933308 | 5/1990 | Germany . |
| 6262052 | 4/1982 | Japan . |
| 61-210627 | 9/1986 | Japan . |
| 1227151 | 4/1971 | United Kingdom . |

OTHER PUBLICATIONS

Fukuda, et al., "Nikkei Microdevices", pp. 108 through 114, Jul. 1990.

*Primary Examiner*—Paul M. Dzierzynski
*Assistant Examiner*—Audrey Chang
*Attorney, Agent, or Firm*—Fitzpatrick, Cella, Harper & Scinto

[57] ABSTRACT

An edge emphasis type phase shift reticle is illuminated obliquely, and zeroth order diffraction light and first order diffraction light caused by a fine pattern of the reticle and having substantially the same intensity are incident and distributed on a pupil of a projection optical system, symmetrically with respect to a predetermined axis, whereby the fine pattern is imaged with use of the zeroth order diffraction light and first order diffraction light.

10 Claims, 10 Drawing Sheets

U.S. PATENT DOCUMENTS

| | | | |
|---|---|---|---|
| 5,191,374 | 3/1993 | Hazama et al. | 355/53 |
| 5,194,345 | 3/1993 | Rolfson | 430/5 |
| 5,237,367 | 8/1993 | Kudo | 355/67 |
| 5,245,384 | 9/1993 | Mori | 355/67 |
| 5,251,067 | 10/1993 | Kamon | 359/628 |
| 5,253,040 | 10/1993 | Kamon et al. | 356/399 |
| 5,264,898 | 11/1993 | Kamon et al. | 355/67 |
| 5,286,963 | 2/1994 | Torigoe | 250/201.2 |
| 5,287,142 | 2/1994 | Kamon | 355/53 |
| 5,296,892 | 3/1994 | Mori | 355/67 |
| 5,436,692 | 7/1995 | Noguchi | 355/71 |

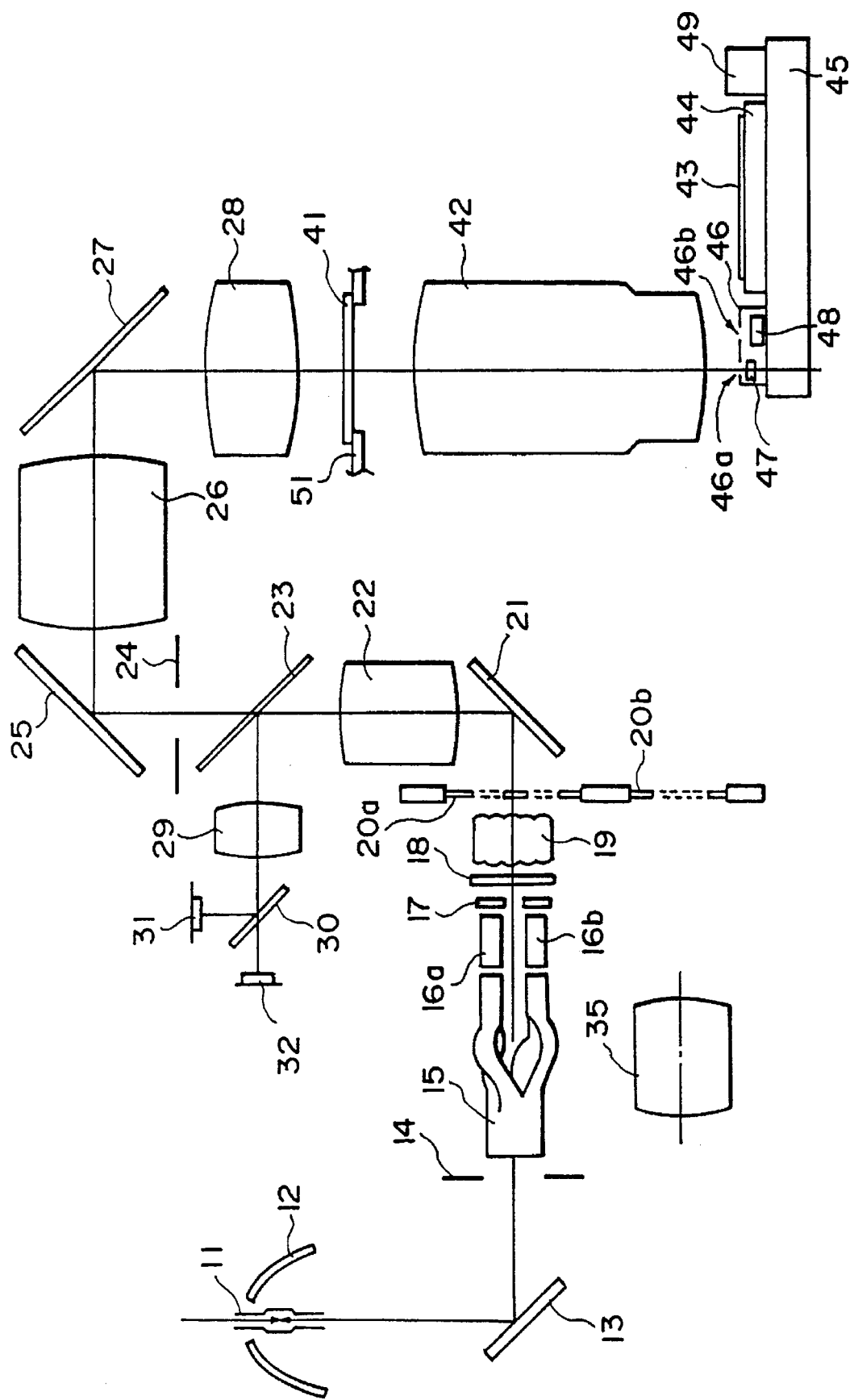
F I G. 4

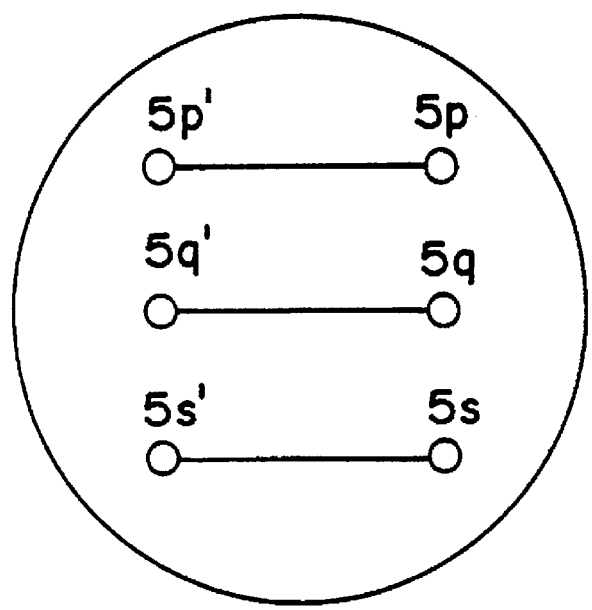
F I G. 5A
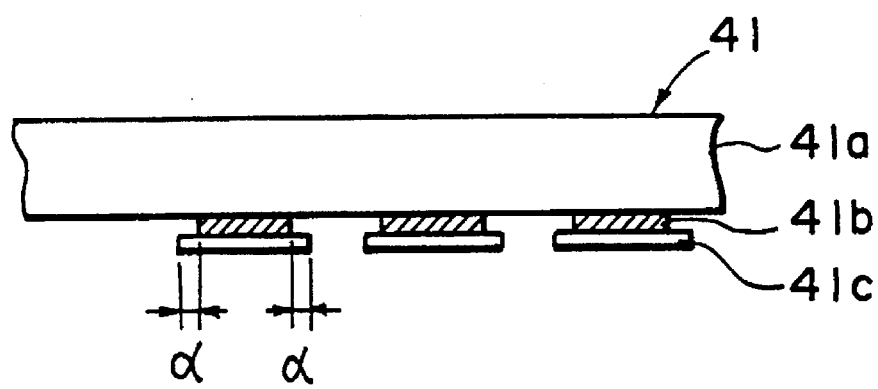
F I G. 5B

IMAGE PROJECTION METHOD AND SEMICONDUCTOR DEVICE MANUFACTURING METHOD USING THE SAME

This application is a divisional of application Ser. No. 08/292,174 filed Aug. 18, 1994, now abandoned, which application is a continuation of prior application Ser. No. 07/921,331 filed Jul. 29, 1992, now abandoned.

FIELD OF THE INVENTION AND RELATED ART

This invention relates to an image projection method and a semiconductor device manufacturing method using the same. More particularly, the invention is concerned with an improved image projection method suitable for forming on a wafer a circuit pattern of a linewidth not greater than 0.5 micron and with an improved semiconductor device manufacturing method based on such an image projection method.

The degree of integration of each semiconductor device such as IC, LSI or the like has been increased more and more and, because of this, the fine processing technique has been improved considerably. Particularly, the exposure technique which is the major processing technique in semiconductor device manufacturing processes has been advanced into a submicron region, with manufacture of 1 mega-DRAM. A representative exposure apparatus therefor is a reduction projection exposure apparatus, called a stepper. It is not an overestimation to say that the resolution of such a stepper determines the future of semiconductor devices.

A conventionally adopted method for improving the resolution of the stepper is mainly to enlarge the numerical aperture (NA) of a projection optical system (reduction lens system). Since however the depth of focus of a projection optical system is in inverse proportion to the square of the NA, enlarging the NA results in a decrease of the depth of focus, causing a difficulty of forming on a wafer an image of good contrast. In consideration of this problem, a recently adopted method for enhancing the resolution is to use shorter wavelengths for the exposure light, such as by using i-line light (365 nm) or KrF excimer laser light (248 nm) in place of g-line light (436 nm). This relies upon an effect that both the depth of focus and the resolution of an optical system increase in inverse proportion to the wavelength.

On the other hand, independently of enlarging the NA of a projection optical system or using shorter wavelengths of exposure light, there is a method of improving the resolution of a stepper by illuminating a reticle in a specific manner. An example according to this method is that a reticle is illuminated with the light which forms a ring-like effective light source (a virtual light source formed by zeroth order light) at a pupil of a projection optical system. With this method, diffraction light (zeroth and first orders) produced by a circuit pattern of a reticle can be projected onto the pupil of the projection optical system.

Another method for improving the resolution, having been considered preferably, is to use a phase shift reticle (mask). According to this method, a mask of conventional type is locally partly provided with a thin film that imparts to light incident on it a phase shift of 180 deg. relative to the light incident on the remaining portion. Many types of such phase shift reticles have been proposed, as referred to in a paper by Fukuda et al ("Nikkei Microdevices", July 1990). A particular phase shift reticle as proposed by Levenson of IBM corporation and called by Fukuda et al as "spatial frequency modulation type", may have an advantage of an enhancement in depth of focus of 50–100% and an enhancement in resolution of 40–50%. However, the phase shift reticle of spatial frequency modulation type involves the problems of:

(1) Unestablished technique for forming a phase shift film;

(2) Unestablished CAD technique optimized to a phase shift film;

(3) Existence of a pattern to which no phase shift film can be put; and (4) Unestablished technique for inspection and correction.

Under these circumstances, the phase shift reticle method cannot be easily practiced in the semiconductor device manufacturing processes.

On the other hand, there is another type of phase shift reticle which is called in the aforementioned paper as "edge emphasis type". This type of phase shift reticle has some advantages over the spatial frequency modulation type phase shift reticle in the point of easiness in manufacture and wideness in applicability: that it does not need complicated manufacturing processes, and that there is no pattern to which a phase shift film cannot be put (as contrasted to the case of the spatial frequency modulation type) and, therefore, the method can be applied to complicated peripheral circuit portions.

SUMMARY OF THE INVENTION

As discussed in the foregoing, conventional image projection methods have respective problems in practice, and an improved image projection method which assures enhancement of resolution is desired.

It is accordingly an object of the present invention to provide an image projection method wherein a fine pattern of an original is illuminated and diffraction light caused by the pattern is projected to a pupil of a projection optical system, for projection of an image of the fine pattern, and wherein an edge emphasis type phase shift reticle is used as the original and the reticle is illuminated with the light which forms at the pupil an effective light source having a higher intensity at its peripheral portion than at its central portion. This assures in a simple manner sufficient enlargement of the depth of focus and resultant enhancement of resolution.

It is another object of the present invention to provide a semiconductor device manufacturing method wherein a circuit pattern of an original is illuminated and diffraction light caused by the pattern is projected to a pupil of a projection optical system, for projection and transfer of an image of the circuit pattern onto a wafer, and wherein an edge emphasis type phase shift reticle is used as the original and the reticle is illuminated with the light which forms at the pupil an effective light source having a higher intensity at its peripheral portion than at its central portion. This assures in a simple manner sufficient enlargement of the depth of focus and resultant enhancement of resolution.

In one preferred form of the present invention, the effective light source may comprise a ring-like effective light source of substantially circular or rectangular shape, having a center coinciding with the center of the pupil. In another preferred form of the present invention, the original may be illuminated with the light that forms an effective light source at the pupil which light source has portions, defined respectively in four quadrants of an x-y coordinate system having its origin coincident with the center of the pupil and having its x and y axes extended along longitudinal and transverse patterns of the fine pattern, each light source portion providing higher light intensity than that at the center of the pupil and that on the x and y axes.

In this specification, the term "edge emphasis type phase shift reticle" means an original wherein a phase shift film is so formed that zeroth order diffraction light and first order diffraction light to be caused by a pattern of a certain linewidth have substantially the same intensity (amplitude).

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a schematic view of a semiconductor device manufacturing projection exposure apparatus to which a method according to the present invention is applied.

FIGS. 5A and 5B are schematic views for explaining the operation of the present invention, wherein FIG. 5A shows pairs of zeroth order light and first order light at a pupil, when a longitudinal pattern of an edge emphasis type phase shift reticle is imaged, while FIG. 5B shows the structure of such an edge emphasis type phase shift reticle.

FIGS. 6A and 6B are schematic views for explaining an image projection method according to a first embodiment of the present invention, wherein FIG. 6A shows a light quantity distribution of an effective light source at a pupil, while FIG. 6B is a graph showing the relationship between the depth of focus and the resolution of an imaging system attainable with this embodiment.

FIGS. 7A and 7B are schematic views for explaining an image projection method according to a second embodiment of the present invention, wherein FIG. 7A shows a light quantity distribution of an effective light source at a pupil, while FIG. 7B is a graph showing the relationship between the depth of focus and the resolution of an imaging system attainable with this embodiment.

DESCRIPTION OF THE PREFERRED EMBODIMENTS

An integrated circuit pattern for use in manufacture of semiconductor devices is mainly comprised of longitudinally and transversely extending basic linear patterns. This is because the design of an integrated circuit is based on longitudinal and transverse directions, namely, x and y directions and, as a result, the pattern of the integrated circuit is primarily formed by patterns extending in x and y directions. In consideration of this, in an embodiment to be described below, such a feature of an integrated circuit pattern and the characteristic of a diffraction pattern by an edge emphasis type phase shift reticle are "combined", and the illumination method is so arranged that a diffraction pattern to be produced by an integrated circuit pattern of an edge emphasis type phase shift reticle becomes analogous to a diffraction pattern to be produced by an integrated circuit pattern of a frequency modulation type phase shift reticle, by which considerable improvement in frequency characteristics in image projection is assured.

Before referring to some embodiments, description will first be made of the manner of imaging of a fine pattern, in cases where a conventional reticle, a frequency modulation type phase shift reticle and an edge emphasis type phase shift reticle are used, respectively.

Figure 1:
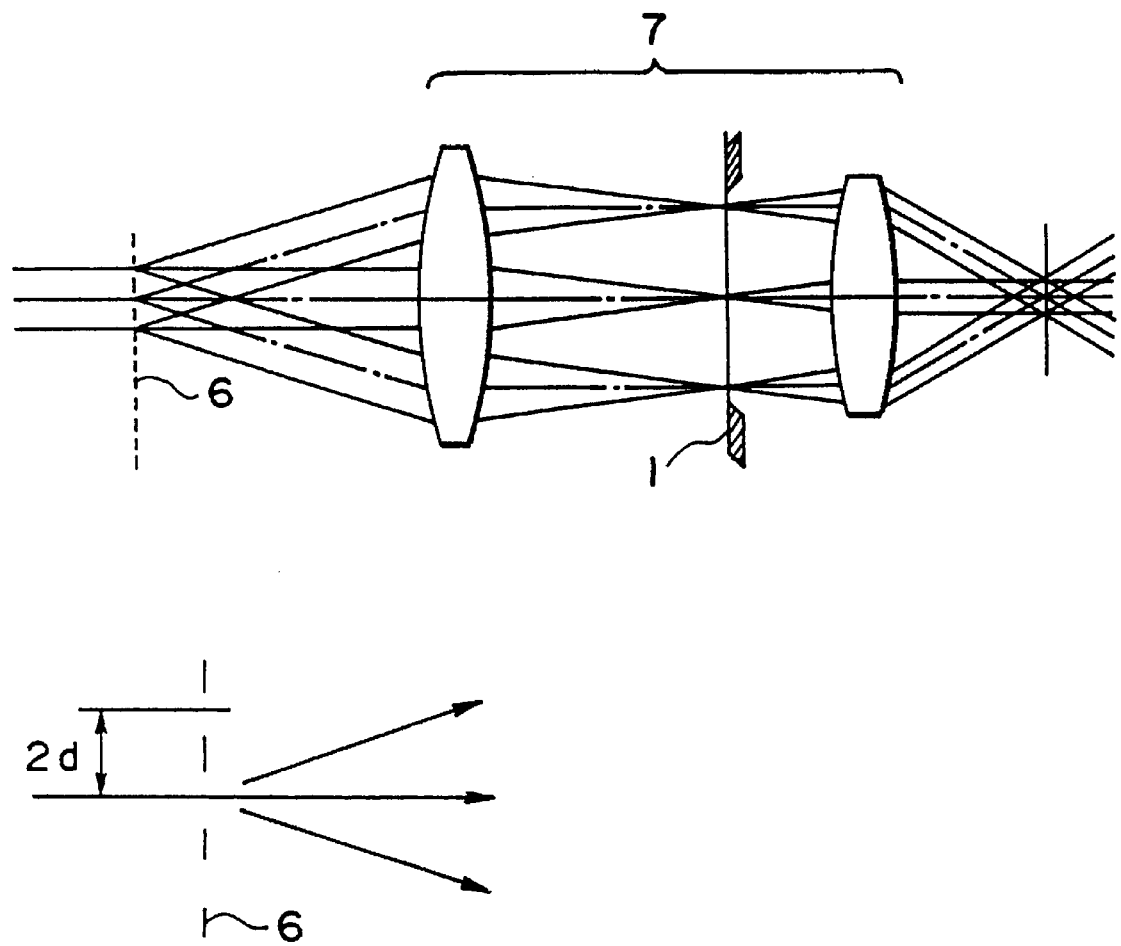
FIG. 1 is a schematic view for explaining imaging of a fine grating pattern.

FIG. 1 shows the manner of imaging of a grating pattern 6 having a pitch $2d$, when it is illuminated in a perpendicular direction. Diffraction light of zeroth order and positive and negative first orders is incident on a pupil (aperture stop) 1 of a projection optical system 7, and diffraction light of these orders from the projection optical system 7 forms a pattern image on an image plane. When the pitch of the grating pattern 6 is small, the light quantity distribution of the diffraction light at the pupil 1 determines the resolution of the projection optical system 1.

Figure 2A:
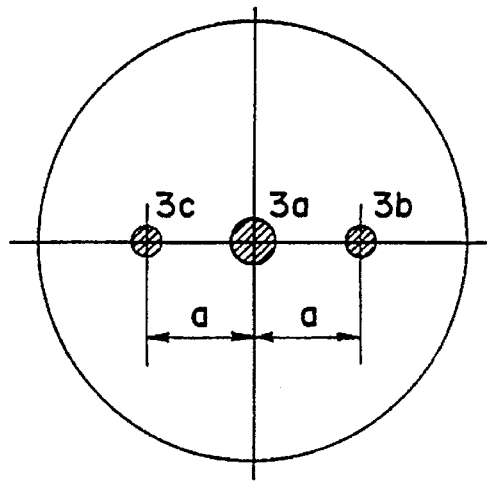
FIGS. 2A–2C are schematic views each showing a light quantity distribution of diffraction light at a pupil of a projection lens system where a particular reticle is illuminated perpendicularly, wherein FIG. 2A corresponds to a case where a conventional reticle is used, FIG. 2B corresponds to a case where a spatial frequency modulation type phase shift reticle is used, and FIG. 2C corresponds to a case where an edge emphasis type phase shift reticle is used.
Figure 2B:
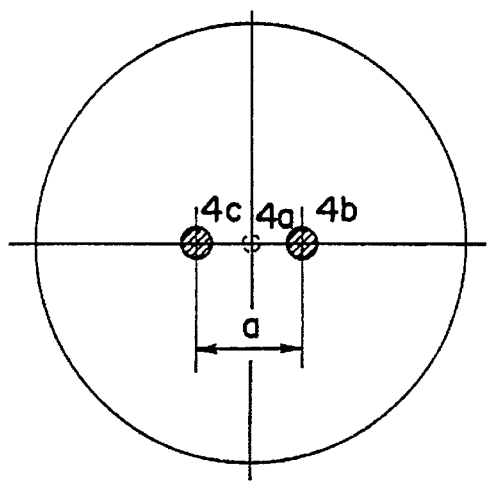
Figure 2C:
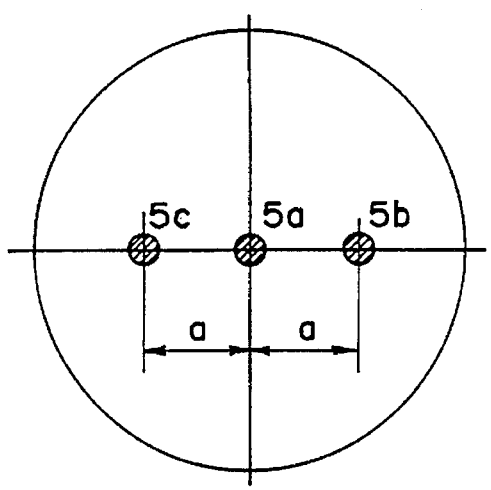

FIGS. 2A–2C each shows a light quantity distribution of diffraction light of different orders, distributed on the pupil 1 (FIG. 1), the distribution being represented with the position and size of each hatched circle. FIG. 2A corresponds to a case where the grating pattern is formed on a conventional reticle, FIG. 2B corresponds to a case where it is formed on a frequency modulation type phase shift reticle, and FIG. 2C corresponds to a case where it is formed on an edge emphasis type phase shift reticle. In FIGS. 2A–2C, reference characters $3a$, $4a$ and $5a$ each denotes distribution of zeroth order light; whereas distribution of positive first order light is denoted at $3b$, $4b$ or $5b$ while distribution of negative first order light is denoted at $3c$, $4c$ or $5c$. It is seen from these drawings that in the case of a frequency modulation type phase shift reticle, as compared with the conventional reticle, the zeroth-order light $4a$ is extinct and only the positive and negative first order lights $4b$ and $4c$ are present. In the case of an edge emphasis type phase shift reticle, while the positions of diffraction lights of these orders are the same as those in the case of a conventional reticle, the intensity ratio among the zeroth order and positive and negative first order diffraction lights is substantially even, as contrasted to the case of a conventional reticle. Character "a" in the drawings denotes the spacing between adjacent diffraction lights. In the case of a frequency modulation type phase shift reticle, to be exact, the extinction of the zeroth order light occurs provided that the phase shift film is formed very accurately so that the portion of the grating pattern with a phase shift film and the portion of the grating pattern without a phase shift film have the same transmission area. For convenience in explanation, however, an idealistic case is illustrated here.

In the frequency modulation type phase shift reticle, distribution of diffraction light on the spatial frequency plane (i.e., pupil plane) has characteristic features that (1) the frequency is reduced to a half and that (2) no zeroth order light is present. However, other than those, the applicants have paid particular attention to the points that: the spacing "a" on the pupil plane between the two diffraction lights $4b$ of the frequency modulation type phase shift reticle is substantially equal to the spacing "a" between the zeroth order light $5a$ and the positive (negative) first order diffraction light $5b$ ($5c$) of the edge emphasis type phase shift reticle; the two diffraction lights $4b$ and of the frequency modulation type phase shift reticle have an amplitude ratio (light quantity ratio) of 1:1, while on the other hand the zeroth order diffraction light $5a$ and the positive (negative) first order diffraction light $5b$ ($5c$) of the edge emphasis type phase shift reticle similarly have an amplitude ratio of 1:1. It is to be noted here that the amplitude ratio of an edge emphasis type phase shift reticle is determined by the linewidth of a pattern concerned and the width of a phase Shift film concerned; and that the width of the phase shift film is optimized in relation to the linewidth so as to attain an amplitude ratio of 1:1 between the zeroth order light and the positive (negative) first order light. And, the applicants have found that: if the illumination is controlled so that, for a spatial frequency of a linewidth RP concerned, for example, a linewidth of a $k_1$ factor of about 0.5 ($RP=k_1 \cdot \lambda/NA$ where $\lambda$ is the wavelength used and NA is the numerical aperture of the projection optical system), the diffraction light from an edge emphasis type phase shift reticle, passing through the pupil 1 of the projection optical system 7, is comprised of zeroth order light and only one of positive first order light and negative first order light, then the diffraction lights distributed on the pupil 1 are at the same positions as those in the case of the spatial frequency modulation type phase shift reticle. Thus, in an embodiment to be described below, illumination light is obliquely projected to the reticle and, as a result of which, while using an edge emphasis type phase shift reticle, diffraction light distribution (spatial frequency distribution) similar to that as attainable with a spatial frequency modulation type phase shift reticle is formed on the pupil.

Figure 3A:
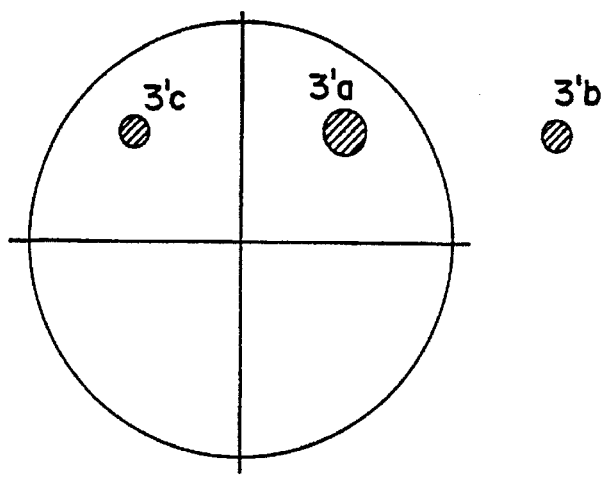
FIGS. 3A–3C are schematic views each showing a light quantity distribution of diffraction light at a pupil of a projection lens system where a particular reticle is illuminated obliquely, wherein FIG. 3A corresponds to a case where a conventional reticle is used, FIG. 3B corresponds to a case where a spatial frequency modulation type phase shift reticle is used (for comparison) and is illuminated perpendicularly, and FIG. 3C corresponds to a case where an edge emphasis type phase shift reticle is used.
Figure 3B:
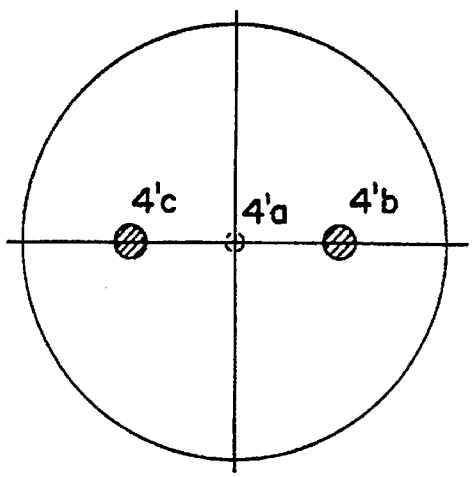
Figure 3C:
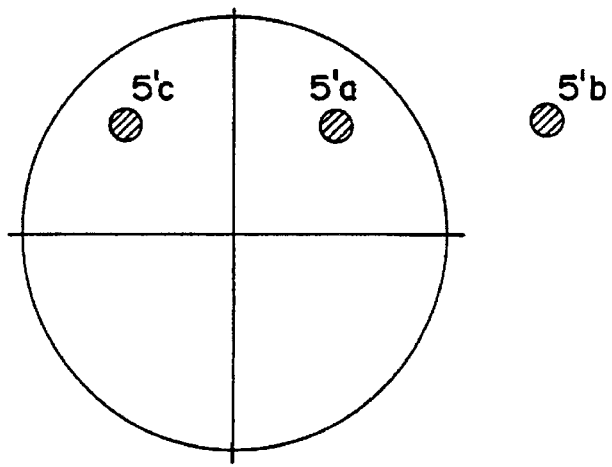

When illumination light is obliquely projected to an edge emphasis type phase shift reticle 41 (FIG. 5B) and it is imaged through the projection optical system 7 (FIG. 1), there is formed on the pupil 1 a spatial frequency distribution such as shown in FIG. 3C. The pattern formed on this reticle 41 comprises repeated longitudinal patterns (lines and spaces) of regular intervals each extending in the longitudinal direction as viewed in FIG. 3. As a result of oblique incidence of illumination light, the zeroth order light $5'a$ is incident at a certain position within the pupil, deviated from the center of the pupil, the first order diffraction light $5'b$ is incident at a position outside the pupil 1, and the negative first order diffraction light $5'c$ is incident at a certain position within the pupil. If the radius of the pupil is standardized to 1 and the linewidth RP of the repeated linear pattern is $RP=k_1 \cdot \lambda/NA$, then the spacing "a" between the zeroth order light and the positive (negative) first order light, on the pupil, is given by an equation $a = \frac{1}{2} k_1$. Thus, if $k_1=0.5$, then $a=1$, and the zeroth order light and the positive (negative) first order light are spaced from each other by a distance corresponding to the radius 1 of the pupil. The longitudinal and transverse lines depicted in FIGS. 3A–3C correspond to y and x axes of an x-y coordinate system with an origin coinciding with the center of the pupil, and the y and x axes of the x-y coordinate system are set in accordance with the directions along which the longitudinal and transverse patterns of an integrated circuit pattern extend.

FIG. 3A shows a spatial frequency distribution on the pupil 1 in a case where illumination light is projected obliquely to a conventional reticle and it is imaged through the projection optical system 7 (FIG. 1). FIG. 3B shows a spatial frequency distribution on the pupil 1 in a case where illumination light is projected perpendicular to a frequency modulation type phase shift reticle, the same as that shown in FIG. 2B, and it is imaged through the projection optical system 7 (FIG. 1). These are illustrated, for comparison.

Symmetrical disposition of diffraction lights on the pupil 1, with reference to the y axis, such as shown in FIG. 3C, assures optimization of a defocus characteristic of the longitudinal pattern of a linewidth RP corresponding to an arbitrary value of $k_1$. Thus, as seen from FIGS. 3B and 3C, in a sense that a pair of diffraction lights of the same intensity (amplitude) pass through the pupil 1, the case of FIG. 3B wherein a frequency modulation type phase shift reticle is illuminated perpendicularly and the case of FIG. 3C wherein an edge emphasis type phase shift reticle is illuminated obliquely with a certain angle, are fully equivalent to each other. For this reason, if illumination light is obliquely projected to the edge emphasis type phase shift reticle of FIG. 5B so that the spatial frequency distribution as shown in FIG. 3C is produced on the pupil, then, for a longitudinal linear pattern of a linewidth RP corresponding to an arbitrary value of $k_1$ (e.g. $k_1=0.5$), the edge emphasis type phase shift reticle can provide substantially the same performance as that of the frequency modulation type phase shift reticle. This is also the case with the imaging on the pupil 1 of the repeated transverse pattern extending along the x axis. In the case of the conventional reticle, since the zeroth order light and the first order light have different intensities, the effect of oblique light projection does not produce a result equivalent to that of the edge emphasis type phase shift reticle. Namely, because the intensity ratio of diffraction lights passing through the pupil 1 is different, the contrast of an image in the case of a conventional reticle would be reduced by about 10% as compared with that in the case of the edge emphasis type phase shift reticle.

As shown in FIG. 5A, as regards the imaging of the longitudinal pattern described with reference to FIG. 3, the zeroth order diffraction light and the first order diffraction light which are paired on the pupil 1 function equivalently, such as in the pair of $5p$ and $5p'$, the pair of $5q$ and $5q'$ and the pair of $5s$ and $5s'$. In FIG. 5A, each character without a dash denotes zeroth order light while each character with a dash denotes first order diffraction light. Namely, when an x-y coordinate system similar to that of FIG. 3 is defined in FIG. 5A, pairs of zeroth order light and first order light incident on those positions having the same x-axis coordinate in the x-y coordinate system while the first order light also passes through the pupil, provide the same effect with respect to the imaging of the longitudinal pattern. A similar relationship applies to the imaging of the transverse pattern, and pairs of zeroth order light and first order light incident on those positions having the same y-axis coordinate in the x-y coordinate system while the first order light also passes through the pupil, provide the same effect with respect to the imaging of the longitudinal pattern. Thus, as has been described with reference to FIGS. 3A through 3C, if the zeroth order light and the first order light are distributed on the pupil 1 of the projection optical system 7 (FIG. 1) at those positions which are symmetrical with respect to the y axis of the x-y coordinate system (in the case of a longitudinal pattern) or the x axis of the x-y coordinate system (in the case of the transverse pattern), then optimum illumination and imaging for longitudinal and transverse patterns of a certain linewidth RP is assured. Since this effect applies also to longitudinal and transverse patterns of a linewidth near the optimized linewidth RP, it is possible to improve the defocus characteristic in the linewidth range in which the resolution is to be considered, by adjusting the spatial frequency to the linewidth of a spatial frequency near $k_1=0.5$, for example.

The applicants thus propose to apply the oblique illumination method to an edge emphasis type phase shift reticle 41 such as shown in FIG. 5B, by which zeroth order light and first order light having substantially the same intensity are produced on the pupil 1 and, additionally, the zeroth order light and the first order light are distributed symmetrically with respect to the y axis of the x-y coordinate system (for a longitudinal pattern) or to the x axis of the x-y coordinate system (for a transverse pattern), by which further improvement in the defocus characteristic in the imaging of longitudinal and transverse patterns of a linewidth RP is assured. Here, the turn oblique illumination means the illumination based on the light which forms an effective light source (zeroth order light) whose intensity at a peripheral portion of the pupil 1 (of the optical axis) is sufficiently larger than that at the central portion of the pupil. More particularly, in this illumination, the edge emphasis type phase shift reticle 41 is illuminated with the light as supplied by a primary light source or a secondary light source having the gravity center of intensity distribution set off the axis of the imaging system.

When an imaging system is optimized to a linewidth RP determined by a certain value $k_1$, the edge emphasis type phase shift reticle 41 may be such that as shown in FIG. 5B the width $\alpha$ of a portion of a phase shift film 41c extending beyond a light blocking portion 41b formed of chromium on a glass substrate 41a is set to be about $0.1 \cdot k_1 \lambda/NA$, when converted with respect to the image plane (wafer surface). This effect applies also to a pattern of a linewidth near this optimized linewidth RP, if a phase shift film with the width $\alpha$ set to about $0.1\ k_1 \lambda/NA$ is formed, and thus further improvement in the defocus characteristic is assured.

Figure 6A:
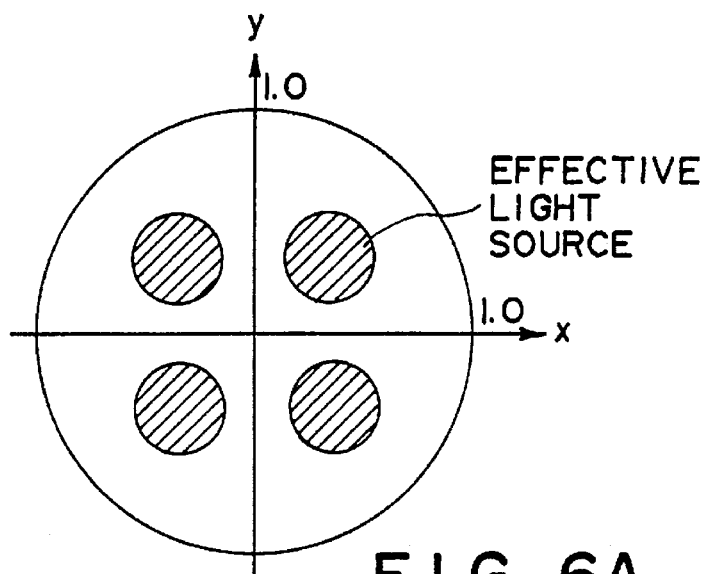

Referring to FIGS. 1 and 5B and based on FIG. 6, a first embodiment of the present invention will be explained. In this embodiment, the edge emphasis type phase shift reticle 41 of FIG. 5B is illuminated with light which forms an effective light source such as shown in FIG. 6A, and an image of fine longitudinal and transverse patterns formed on the reticle 41 is projected through the projection optical system 7 of FIG. 1. The projection optical system 7 comprises a reduction lens system having a design wavelength of i-line light (365 nm) and an NA of 0.5, and the reticle 41 is illuminated with the light as supplied by a secondary light source having a gravity center of intensity distribution set off the axis of the projection optical system 7. In this embodiment, the amount $\alpha$ of overhanging of the phase shift film 41c of FIG. 5B beyond the edge of the light blocking portion 41b is 0.044 micron when converted with respect to the image plane (wafer surface). Since the secondary light source is formed at a position optically conjugate with the pupil 1 of the projection optical system 7, the shape of the secondary light source is analogous to that of the effective light source.

FIG. 6A shows the effective light source as formed on the pupil 1 of the projection optical system 7 of FIG. 1, by the light which illuminates the reticle 41 of FIG. 5B. In FIG. 6A, an x-y coordinate system such as described hereinbefore is set with the origin disposed coincident with the center of the pupil. The y axis of the x-y coordinate system corresponds to (or is parallel to) the elongating direction of a longitudinal pattern of the reticle 41, while the x axis of the x-y coordinate system corresponds to (or is parallel to) the elongating direction of a transverse pattern of the reticle 41. The effective light source 41 of FIG. 6A comprises, when observed macroscopically, four regions (light source portions) disposed in positive and negative 45-deg. directions from the center of the pupil, each region being located in a corresponding one of four quadrants of the x-y coordinate system. If the radius of the pupil is denoted by 1, then each of the regions in the first to fourth quadrants defines a circle of a radius of 0.2, and the centers of these circles are at the coordinates (0.35, 0.35), (−0.35, 0.35), (−0.35, −0.35) and (0.35, −0.35), respectively. The reason why this is in a macroscopic sense is that, in a practical system, each region of the effective light source can be seen as a single region as observed macroscopically, but if it is observed microscopically, there may appear shapes of small lenses of an optical integrator, for example, forming the secondary light source.

Figure 6B:
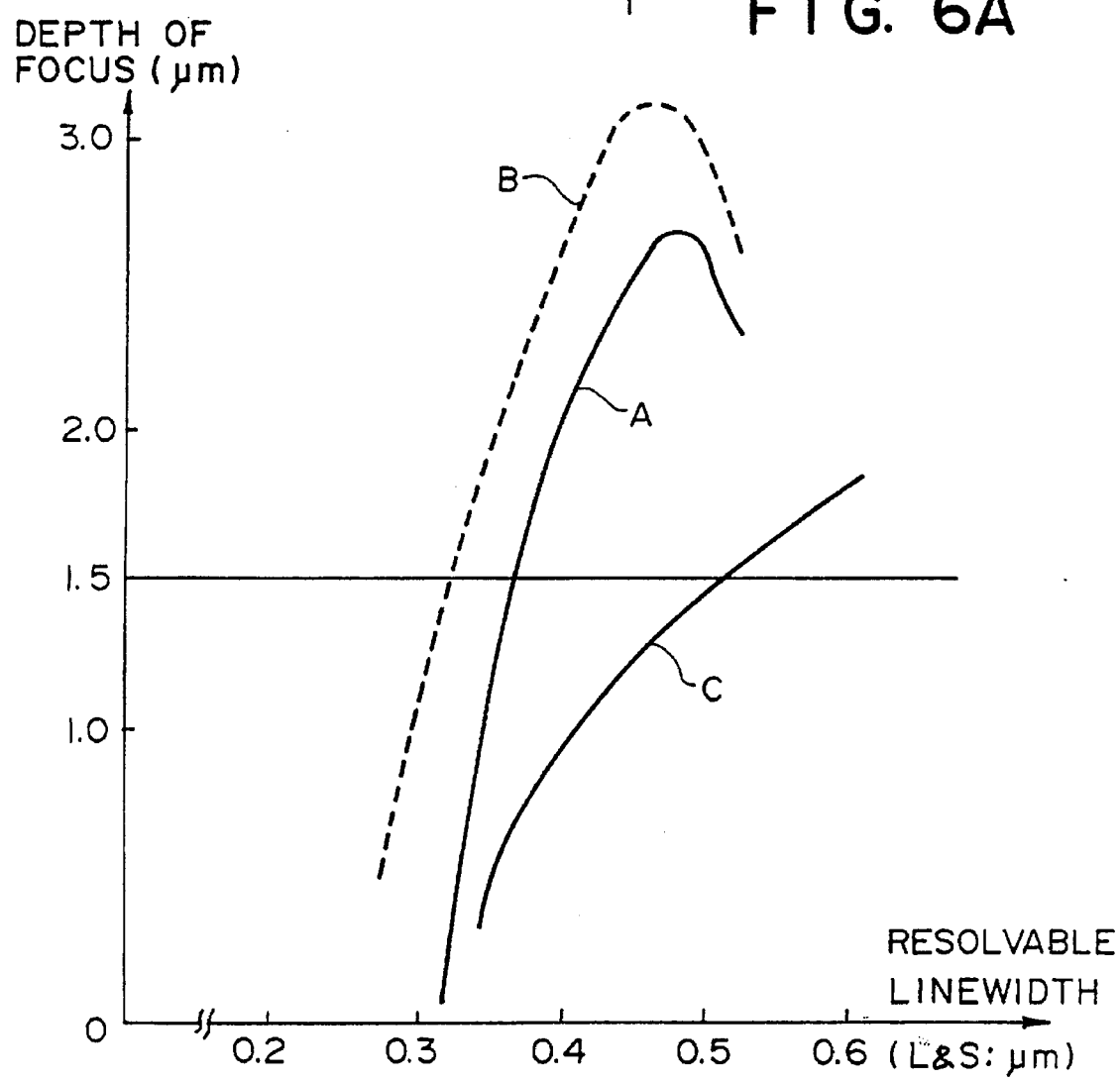

The result of computer simulation made to the frequency characteristic of the imaging system of this embodiment, is shown in FIG. 6B. Solid line A in the drawing depicts the frequency characteristic in a case where a conventional reticle is imaged with light that forms the effective light source of FIG. 6A, and broken line B depicts the frequency characteristic of this embodiment. Solid line C depicts the frequency characteristic in a case where a conventional reticle is illuminated perpendicularly under the condition that $\sigma=0.5$. It is seen from FIG. 6B that, when the practical resolution limit is taken as providing a depth of focus of the projection lens system not less than 1.5 micron, the resolution limit of 0.52 micron (broken line C) can be improved to 0.37 micron (solid line A) by application, to a conventional reticle, of the illumination using the light that forms an effective light source such as shown in FIG. 6A. Also, it is seen that, with the combination of an edge emphasis type phase shift reticle and the illumination using the light that forms the effective light source of FIG. 6A (as in the present embodiment), the resolution limit can be improved to 0.33 micron (solid line B). On the other hand, comparing the depth of focus of the projection lens system while paying attention to a linewidth 0.35 micron, the depth of focus of 0.5 micron (conventional) can be improved to 1.1 micron by the application, to the conventional reticle, of the illumination using the light that forms the effective light source of FIG. 6A. Also, with the combination of the edge emphasis type phase shift reticle and the illumination using the light that forms the effective light source of FIG. 6A (as in the present embodiment), it can be improved considerably to 1.6 micron. Particularly, the resolution of 0.35 micron is one that enables manufacture of 64 MDRAM, and whether such resolution is attainable or not is very important. The capability of forming a pattern of 0.35 micron through a projection lens system of NA of 0.5 and using i-line, as in the present embodiment, directly leads to a possibility of using a projection lens system of a currently commercially available semiconductor device manufacturing projection exposure apparatus (stepper) for manufacture of DRAMs of 64 megabits or more.

When the effective light source is to be formed with the center (light quantity gravity center) of each region of the effective light source being located in the positive or negative 45 deg. direction from the pupil center with respect to the x-y coordinate system of the pupil, it is desired that if the radius of the pupil is taken as 1 the distance of the center of each region from the pupil center is within the range of 0.35–0.8. It is not always necessary that these regions are separate and isolated. They may be continuous. On that occasion, it is preferable that one region of the effective light source is connected to an adjacent region at its corner of a rectangular (square) shape having its center coinciding with the pupil center. Also, on that occasion, the overhanging amount $\alpha$ of the phase shift film 41c of the edge emphasis type phase shift reticle 41, beyond the light blocking portion 41b, should be not greater than about 0.2 $\lambda$/NA (converted with respect to the image plane (wafer surface)), from the viewpoint of the linewidth aimed at.

Figure 8A:
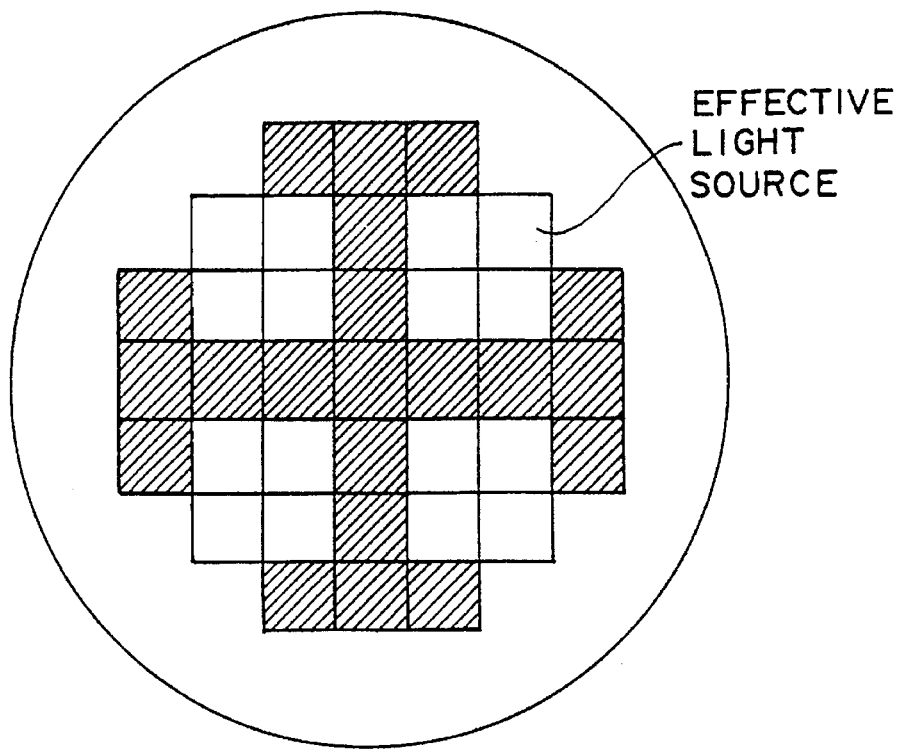
FIGS. 8A and 8B are schematic views each showing an effective light source forming in the neighborhood of a light exit surface of an optical integrator, wherein FIG. 8A corresponds to a case where an effective light source such as shown in FIG. 6A is formed, while FIG. 8B corresponds to a case where an effective light source such as shown in FIG. 7A is formed.
Figure 8B:
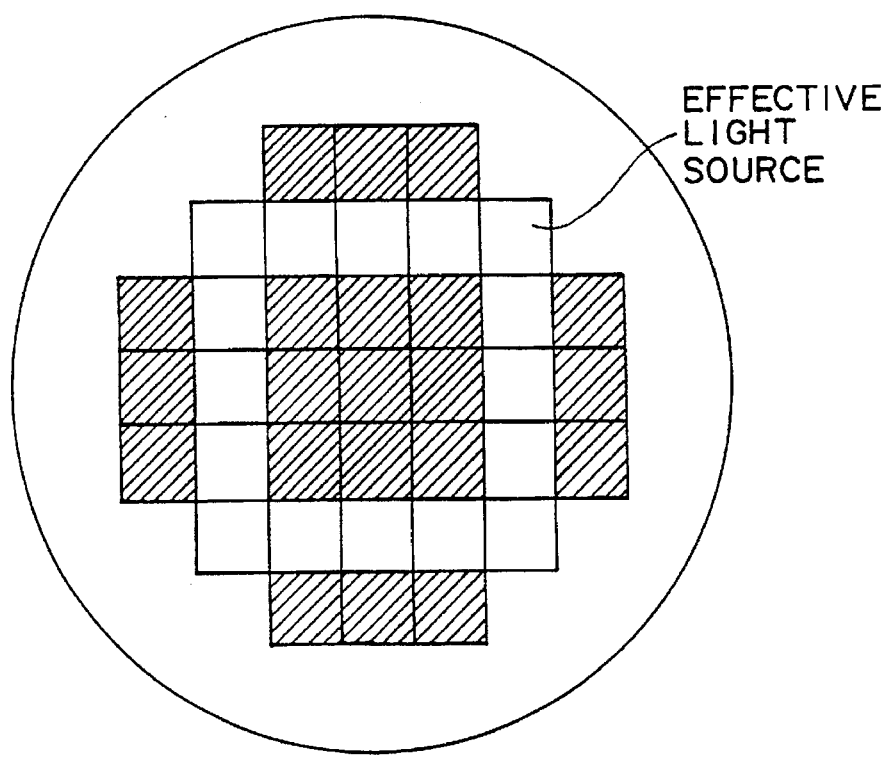

FIGS. 8A and 8B show a second embodiment of the present invention. In this embodiment, the light that forms an effective light source such as shown in FIG. 8A is used to illuminate the edge emphasis type phase shift reticle 41 shown in FIG. 5B, and an image of the fine longitudinal and transverse pattern formed on the reticle 41 is projected through the projection optical system 7 of FIG. 1. The projection optical system 7 comprises a reduction lens system of NA of 0.5, having a design wavelength of i-line (365 nm), and the reticle 41 is illuminated with the light supplied from a secondary light source having its intensity distribution gravity center located off the axis of the projection optical system 7. In this embodiment, the overhanging amount $\alpha$ of the phase shift film 41c of FIG. 5B, beyond the edge of the light blocking portion 41b, is 0.044 micron, as converted with respect to the image plane (wafer surface).

The effective light source shown in FIG. 8B has a rectangular (square) shape with a "hollow" intensity distribution wherein the intensity at the center is low. In FIG. 8B, if the radius of the pupil is taken as 1, the length of each side of the inside rectangular periphery is in a range of 0.3–0.9 while the length of each side of the outside rectangular periphery is in a range of 0.6–1.8. The centers of the inside and outside rectangles coincide with the pupil center (origin of the x-y coordinate system). The direction of each side of the inside and outside rectangular peripheries is parallel to the x axis (direction of a transverse pattern) or the y axis (direction of a longitudinal pattern) of the x-y coordinate system set in alignment with the major directions of the integrated circuit pattern of the reticle 41. Here, the configuration of the effective light source of this embodiment such as above is one when it is seen macroscopically.

Figure 7A:
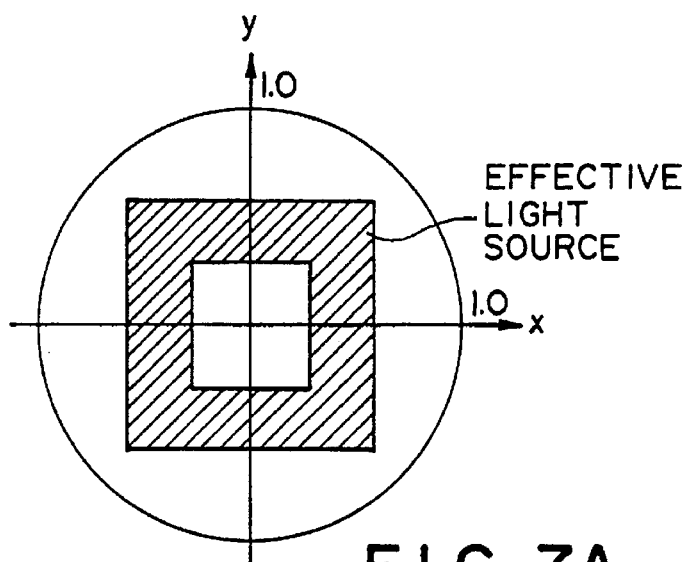
Figure 7B:
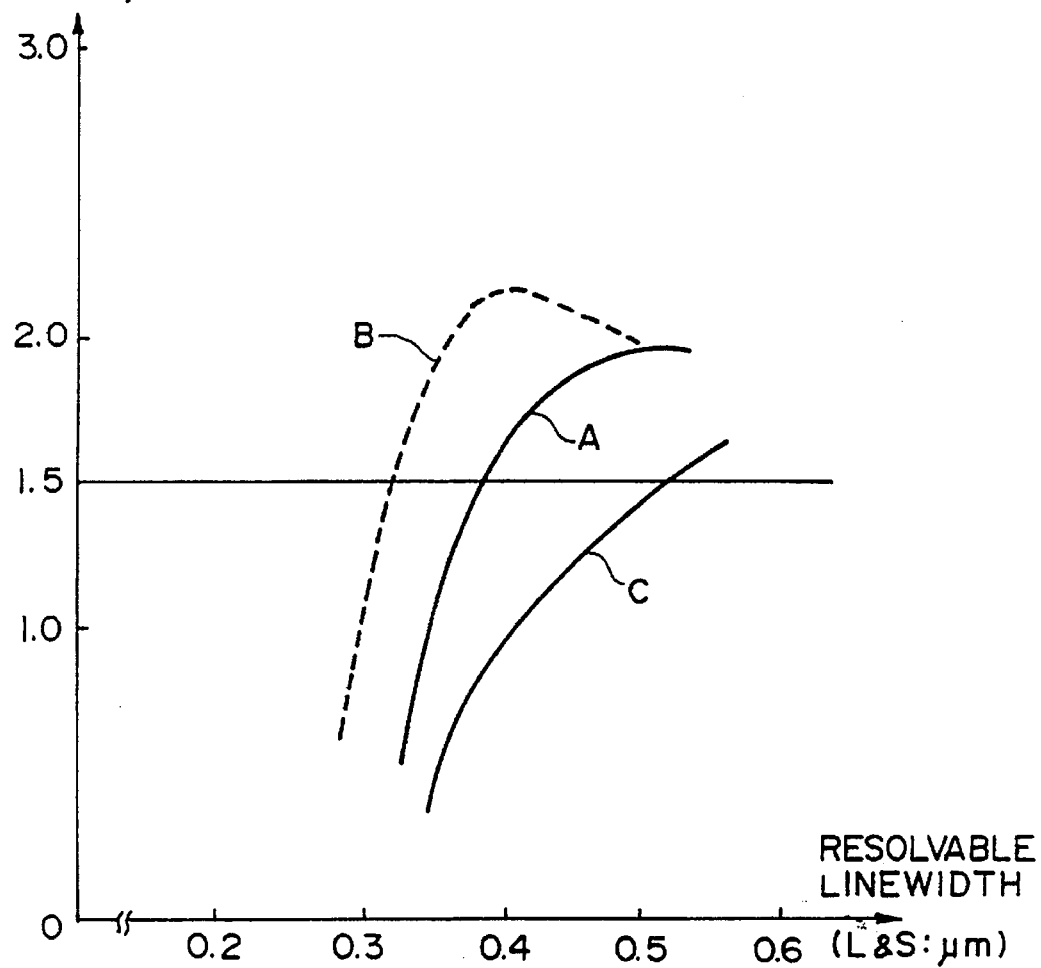

The result of computer simulation made to the frequency characteristic of the imaging system of this embodiment, is shown in FIG. 7B. Solid line A in the drawing depicts the frequency characteristic in a case where a conventional reticle is imaged with light that forms the effective light source of FIG. 7A, and broken line B depicts the frequency characteristic of this embodiment. Solid line C depicts the frequency characteristic in a case where a conventional reticle is illuminated perpendicularly under the condition that $\sigma$=0.5. It is seen from FIG. 7B, particularly from a comparison of lines A, B and C, that, where the practical resolution limit is taken as providing a depth of focus of the projection lens system not less than 1.5 micron, in this embodiment the resolution limit can be improved nearly to 0.33 micron, like the first embodiment, by the combination of an edge emphasis type phase shift reticle and the illumination using the light that forms the effective light source of FIG. 7A. On the other hand, comparing the depth of focus of the projection lens system while paying attention to a linewidth of 0.35 micron, with the combination of the edge emphasis type phase shift reticle and the illumination using the light that forms the effective light source of FIG. 7A, in the present embodiment, it can be improved considerably to 1.6 micron, like the first embodiment. Thus, also in this embodiment, both the depth of focus and the resolution can be improved considerably in the high frequency region. As a result, with the combination of an edge emphasis type phase shift reticle and the illumination using the light that forms an effective light source such as shown in FIG. 7A, it becomes possible to form a pattern of 0.35 micron through a projection lens system of NA of 0.5, using i-line.

As regards the shape of the effective light source of this embodiment, when in FIG. 7A the length of each side of the outside rectangular periphery is taken as $2a$ while the length of each side of the inside rectangular periphery is taken as $2b$ and the radius of the pupil is taken as 1, the quantity (a+b)/2 should preferably be in the range of 0.25–0.6. Also, the overhanging amount $\alpha$ of the phase shift film 41c of the reticle 41, beyond the light blocking portion 41b, should be not greater than 0.2 $\lambda$/NA (converted with respect to the image plane (wafer surface)), from the viewpoint of the linewidth aimed at.

As regards the shape of the effective light source usable in the present invention, there may be many varieties other than those shown in the first and second embodiments. An example may be an effective light source of ring-like shape with its center coinciding with the pupil center.

FIG. 4 shows an embodiment of a semiconductor device manufacturing projection exposure apparatus that uses the method of the present invention.

Ultra-high pressure Hg lamp 11 has its arc placed at a first focal point of an elliptical mirror 12. Light emanating from the Hg lamp 11 is reflected by the elliptical mirror 12 and then by a deflecting mirror 13, and it is focused in the neighborhood of a second focal point of the elliptical mirror 12. A light entrance end of a fiber bundle 15 is disposed adjacent to the second focal point, and a shutter 14 is placed just in front of the fiber bundle 15. The fiber 15 has a light exit end adjacent to which a light entrance end of an optical rod 16 is placed. The optical rod 16 serves to transmit (diffuse) the light from the fiber bundle 15 so as to transform a non-uniform light intensity distribution, at the light exit end of the fiber bundle 15, to make uniform the light intensity distribution at the light exit end of the rod. Disposed at the side of the light exit end of the optical rod 16 is an intensity adjusting member 17 and, after it, a wavelength selecting filter 18 is placed. While the fiber bundle 15 has a single light entrance surface, its light exit surface is divided into four sections. The optical rod 16 comprises four rods 16a–16d corresponding to the four sections of the fiber bundle 15, respectively. The rods 16c and 16d are not illustrated in FIG. 4. Also, the intensity adjusting member 17 comprises four elements corresponding to the four rods 16a–16d, but only two of them are illustrated.

In the apparatus of this embodiment, the edge emphasis type phase shift reticle 41 shown in FIG. 5B is illuminated with the light that forms, on the pupil of the projection lens system 42, an effective light source such as shown in FIG. 6A, and an image of the circuit pattern of the reticle is projected. Namely, the image projection method having been described with reference to the first embodiment is applied. It is important that the regions of the effective light source defined in the four quadrants (see FIG. 6A) of the pupil of the projection lens system 42 have a substantially even intensity ratio. This is because, if the four regions of the effective light source have an imbalance of 5% or more with respect to the intensity ratio, there occurs distortion of the image in the defocused state. The intensity adjusting member 17 serves to adjust the intensity ratio of the regions of the effective light source, and the four elements of it may comprise ND filters of variable density, interference filters of variable tilt angle, or the like. They serve to adjust the relative intensity ratio of the lights emanating from the four rods to thereby suppress the imbalance of the intensity ratio of the four sections of the effective light source, to not greater than 5%. The light from each element of the intensity adjusting member 17 goes through the wavelength selecting filter 18 and enters an optical integrator 19. The wavelength selecting filter 18 serves to selectively transmit i-line (365 nm) of the light from the Hg lamp 11, such that it provides exposure light of narrow bandwidth.

The optical integrator 19 comprises a combination of small lenses, and it serves to form, with the four lights incident on its light entrance surface, a secondary light source having a shape analogous to the shape of the effective light source of FIG. 6A, wherein the secondary light source is formed in the neighborhood of the light exit surface of the integrator. The position whereat the secondary light source is formed is optically conjugate with the pupil of the projection lens system 42 and, through the operation of the optical rod 16, each of the four regions of the secondary light source has a substantially uniform intensity distribution. Aperture stop 20a has four openings corresponding to the shape of the secondary light source formed by the optical integrator 19, and it serves to further rectify the shape of the secondary light source as formed by the integrator 19. The stop 20a may be placed in front of the integrator 19 or at a position optically conjugate with the position illustrated.

Relay lens system 35 and an aperture stop 20b which are in the neighborhood of the optical integrator 19 are provided to change the manner of illumination in accordance with the type of a reticle to be introduced into the apparatus. This is because those of the semiconductor device manufacturing processes which require a high resolution are practically about one-third of the total processes and, in the remaining processes, a sufficiently sharp pattern image can be projected by using the conventional illumination method and conventional reticles. When a conventional reticle is to be introduced into the apparatus, the optical system from the fiber 15 to the adjusting member 17 is demounted and the relay lens system 35 is mounted thereat. Additionally, the aperture stop 20a is replaced by the aperture stop 20b. Such replacement may be made automatically or manually. The relay lens system 35 is arranged to re-focus the arc image of the elliptical mirror 12, formed at the second focal point of the mirror 12, upon the light entrance surface of the optical integrator 19 through the wavelength selecting filter 18, such that, on the light entrance surface of the integrator 19, a single light beam having a Gaussian intensity distribution wherein the intensity is higher at the center (optical axis) than at a peripheral portion (off the axis) is incident. Thus, the aperture of the stop 20b has a circular shape defined about the optical axis. The relay lens system 35 may be structured so as to place the light exit surface (opening) of the elliptical mirror 12 and the light entrance surface of the optical integrator 19 in an optically conjugate relationship.

Denoted at 21 is a mirror for deflecting the path of light passing through the aperture of the stop 20a, and denoted at 22 is a lens system for projecting the light reflected by the mirror 21 to a half mirror. This lens system 22 plays an important role in controlling the uniformness of the illuminance distribution upon the reticle 41. A portion of the light from the lens system 22 is reflected by the half mirror 23, and this portion is directed by a lens 29 to another half mirror 30. By this half mirror 30, the light is further bisected, and split light beams are directed to corresponding two photoelectric detectors 31 and 32, separately. The photoelectric detector 31 comprises an intensity distribution detector provided by a CCD, for example, for monitoring the intensity distribution or shape of the secondary light source. On the basis of an output signal from the detector 31, the adjustment of the regions of the secondary light source through the elements of the intensity adjusting member 17 is executed. On the other hand, the photoelectric detector 32 is a component of what can be called an integration exposure meter for monitoring the amount of exposure during the exposure operation. On the basis of an output of the detector 32, the opening and closing of the shutter 14 is controlled, for control of the exposure amount. The half mirror 30 may be replaced by an ordinary mirror and the path of light from the lens system 22 may be selectively changed to the detector 31 side or to the detector 32 side, between the adjustment of the secondary light source and the exposure operation.

The portion of the light from the lens system 22 that passes the half mirror 23, illuminates a blade 24 which is a field stop. The blade 24 comprises a masking blade having an aperture whose shape can be adjusted by a mechanical adjusting means, and it serves to block a desired portion of the light from the lens system 22 against impingement of the same on the reticle 41. The aperture of the blade 24 is in an optically conjugate relationship with the surface of the reticle on which the circuit pattern is formed. The aperture edge position of the blade 24 is adjusted by a driving system (not shown) in accordance with the size of the integrated circuit pattern area of the reticle 41 to be exposed. Denoted at 25 is a mirror, denoted at 26 is a lens system, denoted at 27 is another mirror, and denoted at 28 are another lens system. Through these elements (25–28), the light from the secondary light source as formed by the optical integrator impinges and illuminates the reticle 41 which is placed on a reticle stage 51. Also, these elements (25–28) serve to project an image of the aperture of the blade 24 upon the reticle 41 and, additionally and through cooperation with some lens or lenses of the projection lens system 42, they serve to project an image of the secondary light source (aperture stop 20a) upon the pupil of the projection lens system 42. This image of the secondary light source projected on the pupil is what has been called an "effective light source", and this has a light quantity distribution such as shown in FIG. 6A.

The projection lens system 42 comprises a lens assembly designed mainly with reference to light of i-line. It serves to project a reduced image of the circuit pattern of the reticle 41 on a wafer 43 to thereby transfer the circuit pattern to a resist applied to the wafer 43. Semiconductor chips can be manufactured from the wafer 43 having circuit patterns transferred in this manner. The wafer 43 is attracted to and held by a wafer chuck 44, and it is placed on a stage 45 whose position with respect to an x-y coordinate system can be controlled by means of laser interferometers (not shown) and a driving system (not shown). The stage 45 can operate to move the wafer chuck 43 in the direction of the optical axis of the projection lens system 42 and also to tilt the wafer chuck 43, so as to focus the wafer 43 surface on the image plane of the projection lens system 42. Denoted at 49 is a reflecting mirror for a laser interferometer fixedly mounted on the wafer stage 45.

Figure 10:
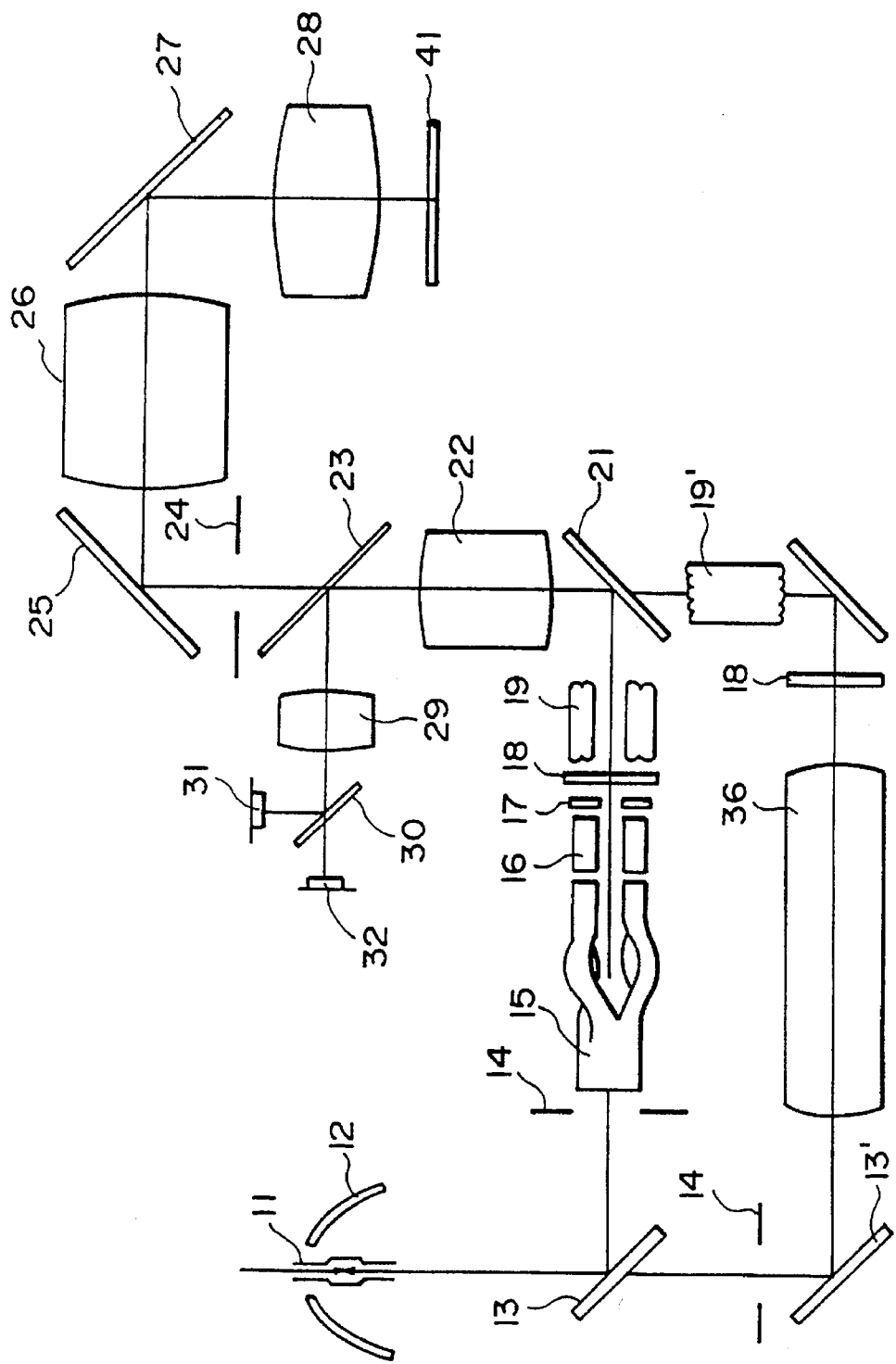
FIG. 10 is a schematic view of another modified form of the apparatus of FIG. 4.

Denoted at 46 is a photoelectric detection unit mounted on the stage. The unit 46 has pinholes 46a and 46b as well as photoelectric detectors 47 and 48 corresponding to these pinholes, respectively. The photodetector 47 serves to measure the quantity of light passing through the pinhole 46a, for measurement of non-uniformness on the image plane of the projection lens system 42, for example. On the other hand, the photodetector 48 is provided for the same sake as that of the photoelectric detector 31, and it comprises an intensity distribution detector such as a CCD, for example, for measuring the light quantity distribution of the effective light source upon the pupil, actually through the intervention of the projection lens system 42. Thus, the adjustment of the regions of the effective light source (secondary light source) with the elements of the intensity adjusting member 17 may be executed by using the output of the photoelectric detector 48 at the stage 45 side. Also, the output of the photoelectric detector 48 may be used to calibrate the adjustment of the intensities of the regions of the secondary light source by the photoelectric detector 31 at the illumination system side. FIG. 8A shows the secondary light source as the optical integrator 19 is seen through the aperture stop 20a. Hatched portions in FIG. 8A depict the portions blocked by the stop 20a, and rectangular blank portions correspond to the openings of the stop 20a. Each of small squares constituting one blank portion corresponds to one of the small lenses (their sections) constituting the optical integrator 19. The integrator 19 may be formed by a combination of small lenses each having a hexagonal or circular sectional shape. As in the preceding embodiment, also in FIG. 8A, the longitudinal direction as viewed in the drawing corresponds to the y axis of the x-y coordinate system, and the transverse direction corresponds to the x axis of the x-y coordinate system. The origin of the x-y coordinate system coincides with the center as viewed in the drawing, namely, the center (optical axis) of the optical integrator 19. The x and y axes of the x-y coordinate system are set in alignment with the axes of the orthogonal coordinates used in the design of the circuit pattern of the reticle 41. These directions correspond to the directions of elongation of longitudinal and transverse linear patterns, respectively, mainly by which the circuit pattern of the reticle 41 is defined. It may be said that these directions correspond to the longitudinal and transverse directions of the outside periphery of the reticle 41 which has a square shape. Further, in FIG. 8A, the outside circle depicts a circle which corresponds to the pupil of the projection lens system. As shown in FIG. 8A, when an effective light source having a certain light quantity distribution is to be actually provided, it is restricted by the sectional shape of each small lens of the optical integrator 19 and/or the outside general shape of it. Thus, if the optical integrator 19 is provided by four small lens groups such as shown in FIG. 10, then, in order to attain the effective light source such as in the first embodiment, it is necessary to take some measures to assure that light does not pass through the hatched portions in FIG. 8A. For this reason, in this embodiment, the arrangement shown in FIG. 8A is adopted to attain the effective light source shown in FIG. 6A. Generally, in an illumination system for providing a high resolution, the size of the optical integrator 19 may be larger than that required in a conventional illumination system, and it may be more advantageous if the outside peripheral portion of the illumination system having a larger view angle is usable. For example, when the largest view angle of the illumination system is taken as 1, in a conventional illumination system it may be preferable to use an optical integrator of a radius not greater than 0.5; whereas in an illumination system for high resolution it may be preferable to use an optical integrator 19 having its small lenses distributed within a circle of a maximum radius of 0.8, although those small lenses disposed in the central portion are not used. Thus, in the present embodiment, the size of the optical integrator as well as the effective diameter of the other portion of the illumination system are set while taking into account both of such a conventional type illumination system and a high-resolution type illumination system (i.e. to be used in both cases).

In the apparatus of this embodiment, in accordance with the type of a reticle to be used, an illumination system corresponding to the reticle concerned can be selected. This makes it possible to provide an exposure optical system best suited to the parameters (such as minimum linewidth, for example) of the circuit pattern. The selection of the illumination system may be made automatically by, for example, reading the linewidth information recorded in the form of a bar code on the reticle by using a bar code reader or the like and by inputting the information into the control computer of the apparatus.

There may be a problem in relation to changing the illumination system, i.e., a possibility that the illuminance distribution on the reticle shifts with the changing. If this occurs, the illuminance distribution can be adjusted finely by adjusting the lens system 22. Such fine adjustment of the illuminance distribution can be done by changing the interval or intervals of the lenses constituting the lens system 22, along the optical axis of the lens. Alternatively, the lens system 22 may be replaced by a separate lens system prepared beforehand. On that occasion, plural lens systems like the lens system 22 may be prepared and they may be used interchangeably in accordance with the type of a reticle used.

In the present embodiment, an effective light source such as shown in FIG. 6A is formed on the pupil of the projection lens system 42 and, in accordance with the method described with reference to the first embodiment, an image of a circuit pattern of an edge emphasis type phase shift reticle is projected. However, it is easy to modify the structure so that an effective light source such as shown in FIG. 7A is formed on the pupil of the projection lens system 42 and the image of the circuit pattern of the edge emphasis type phase shift reticle is projected in accordance with the method described with reference to the second embodiment. In order to practice the method of the second embodiment, as an example a light (reversal Gaussian distribution) having a higher intensity at its peripheral portion than at its central portion may be projected to the optical integrator 19 while, on the other hand, an aperture stop effective to define the secondary light source of FIG. 8B may be placed just after the optical integrator 19.

Figure 9:
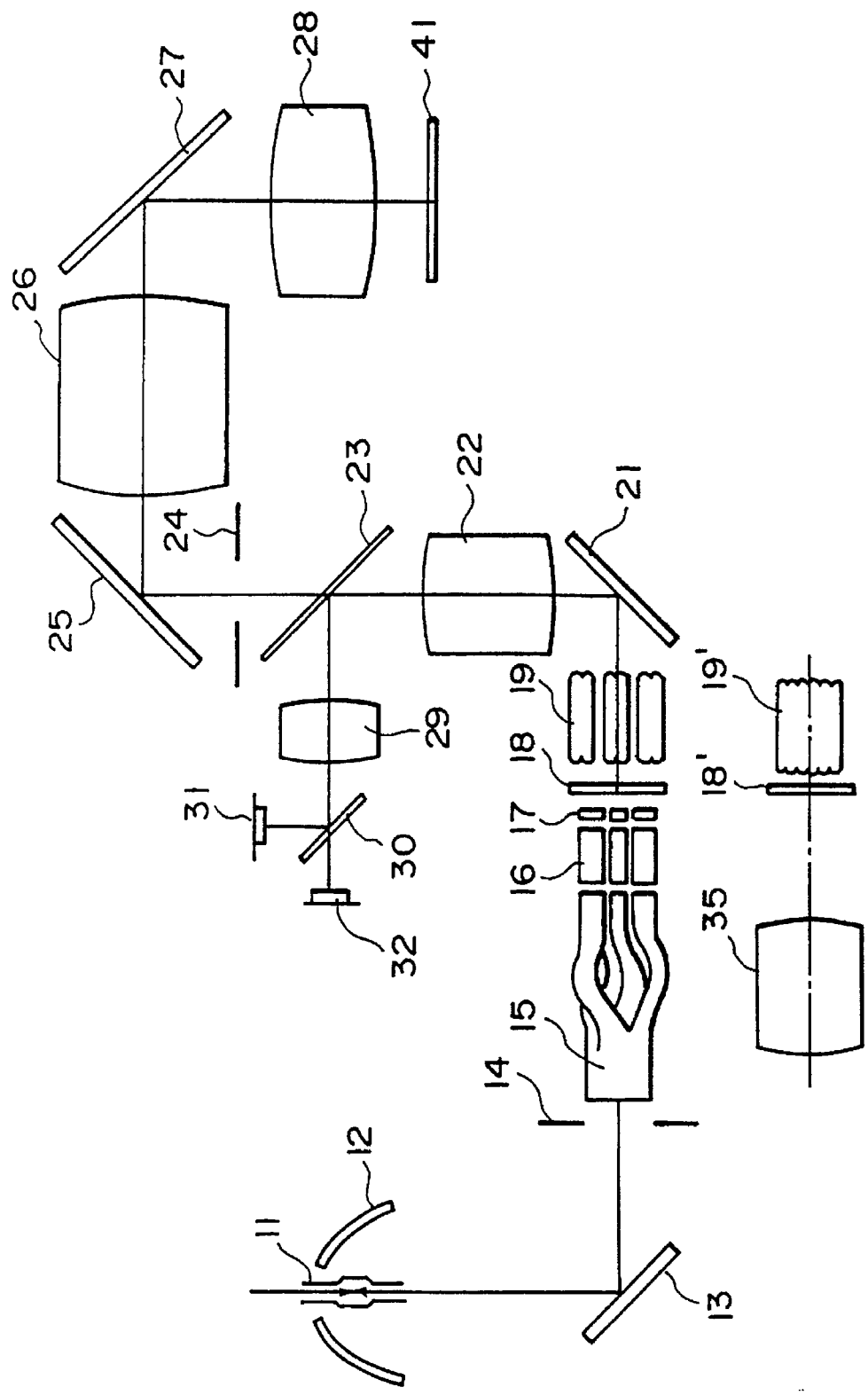
FIG. 9 is a schematic view of a modified form of the apparatus of FIG. 4.

FIGS. 9 and 10 are fragmentary schematic views each showing a modified form of the FIG. 4 apparatus. In these drawings, like numerals as those of the FIG. 4 apparatus are assigned to corresponding elements. Further, since those elements disposed below the reticle 41 are similar to those of FIG. 4, they are not illustrated in these drawings.

An important feature of the FIG. 9 apparatus resides in that the optical integrator 19 itself is changed in response to changing the illumination condition in accordance with the type of a reticle to be used. This can widen the latitude with respect to the placement of small lenses constituting the optical integrator 19. The widened latitude of placement of the small lenses appears in FIG. 9 as separately disposed small lens groups of the optical integrator 19. Like the FIG. 4 apparatus, the elements of the optical rod 16 correspond to the lens groups of the optical integrator 19. Among the small lenses of each lens group corresponding to one rod, uniform illuminance is attained. This contributes to uniformizing the intensity distribution of a partial secondary light source (effective light source) defined by this lens group. Denoted in FIG. 9 at 18' is a wavelength selecting filter of the illumination system prepared for replacement, and denoted at 19' is an optical integrator of the illumination system prepared for replacement. The optical integrator 19' has essentially the same structure as that shown in FIG. 4.

An important feature of the FIG. 10 apparatus resides in that two light paths are defined partially in the illumination system and these two light paths are used interchangeably in accordance with the type of reticle used and by insertion or extraction of mirrors 13 and 21. The upper light path in FIG. 10, being deflected by the mirrors 13 and 21, corresponds to the high-resolution illumination system to be used for an edge emphasis type phase shift reticle 41, while the lower light path being deflected by the mirrors 13' and 21' corresponds to an ordinary illumination system to be used in a process in which only a resolution not lower than 1.0 ($k_1$), for example, is required. Denoted at 36 in FIG. 10 is a relay optical system.

In the apparatuses shown in FIGS. 4, 8A, 8B and 9, only one Hg lamp 11 is used. However, plural light sources may be used. For example, in the apparatus of FIG. 9, separate Hg lamps may be used in relation to the pair of light paths. Further, in the apparatuses of FIG. 4, 8A and 8B and 9, the fiber bundle 15 may have a light exit surface of rectangular shape while, on the other hand, an aperture stop for defining the secondary light source of FIG. 8B may be disposed just after the optical integrator 19. Thus, the shape of the fiber bundle 15 may be modified to assure enhancement in the efficiency of light utilization.

Since an edge emphasis type phase shift reticle can be applied to light of a wavelength 190-250, it is possible to provide an apparatus which includes a KrF or an ArF excimer laser as a light source. When an excimer laser is used, the illumination system may be provided with a scanning system, for example, for scanning with respect to time the optical integrator with an expanded laser light. If laser light is inputted obliquely to an edge emphasis type phase shift reticle so as to form, with the scanning illumination using the laser light, an effective light source of FIG. 6A or 7A on the pupil of the projection optical system, then the image projection method described with reference to the first or second embodiment is accomplished.

Further, in the apparatuses shown in FIGS. 4, 8A and 8B and 9, an image of a pattern of an edge emphasis type phase shift reticle is projected through the projection lens system 42. However, it is possible to use a projection mirror system in place of the lens system, to project an image of the pattern of the edge emphasis type phase shift reticle.

As described hereinbefore, in the present invention, an edge emphasis type phase shift reticle is illuminated with light that forms on a pupil of a projection optical system an effective light source having a higher intensity at a peripheral portion thereof than at its central portion, by which both the resolution limit of the projection optical system and the depth of focus in the neighborhood of the resolution limit can be improved considerably. Namely, the present invention assures manufacture of 64 MDRAMs, while using an edge emphasis type phase shift reticle (which is easy to prepare) and making small modification to an exposure apparatus having a projection optical system with NA=0.5 and a design wavelength of i-line (which is currently commercially available).

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus comprising:

illumination means for illuminating a reticle;

a projection optical system for projecting a pattern of the reticle onto a wafer;

first detecting means for detecting a light intensity distribution on an image plane of said projection optical system; and second detecting means for detecting a light intensity distribution on a pupil of said projection optical system.

2. An apparatus according to claim 1, wherein said first detecting means comprises a movable stage for carrying the wafer and a first detecting unit mounted on said stage, said first detecting unit comprising a pinhole and a photodetector for detecting light through the pinhole, and wherein said second detecting means comprises a second detecting unit mounted on said stage, said second detecting unit comprising a pinhole and an array of photodetectors for receiving light from said pinhole.

3. An apparatus according to claim 2, wherein said illumination means comprises a fly's eye lens for receiving light from a light source, and an aperture stop disposed adjacent to a light exit surface of said fly's eye lens, wherein light from said fly's eye lens passing through an opening of said aperture stop irradiates the reticle.

4. An apparatus according to claim 3, wherein said aperture stop has four openings formed off an optical axis.

5. An apparatus according to claim 3, wherein said aperture stop has a plurality of openings formed off an optical axis.

6. An apparatus according to claim 3, wherein said illumination means comprises a first aperture stop having an opening formed off an optical axis, and a second aperture stop having an opening formed on the optical axis, wherein one of the first and second aperture stops is selectively supplied and placed adjacent to the light exit surface of said fly's eye lens.

7. An apparatus according to claim 6, wherein said illuminating means comprises first and second optical members, selectively insertable between said light source and said fly's eye lens, for changing the light intensity distribution of the light incident on the fly's eye lens.

8. An apparatus according to claim 7, wherein said optical members and said apertures are interrelated.

9. An apparatus according to claim 8, wherein said illuminating means comprises correcting means for correcting illuminance unevenness on the image plane, and said correcting means is interrelated with said optical members and said apertures.

10. A device manufacturing method which comprises a printing step for printing a device pattern on a substrate by use of a projection exposure apparatus as recited in any one of claims 1 through 9.

* * * * *

UNITED STATES PATENT AND TRADEMARK OFFICE
CERTIFICATE OF CORRECTION

PATENT NO. : 5,631,773
DATED : May 20, 1997
INVENTOR(S) : AKIYOSHI SUZUKI

It is certified that error appears in the above-identified patent and that said Letters Patent is hereby corrected as shown below:

ON THE COVER PAGE

AT ITEM [56] "FOREIGN PATENT DOCUMENTS"

"6262052  4/1982  Japan" should read --57-62052--. 4/1982  Japan--.

COLUMN 2:

Line 64, "pupil" should read --pupil,--.

COLUMN 5:

Line 11, "4b" should read --4b and 4c--;

Line 16, "and" should read --and 4c--; and

Line 24, "Shift" should read --shift--.

UNITED STATES PATENT AND TRADEMARK OFFICE
CERTIFICATE OF CORRECTION

PATENT NO. : 5,631,773

DATED : May 20, 1997

INVENTOR(S) : AKIYOSHI SUZUKI

It is certified that error appears in the above-identified patent and that said Letters Patent is hereby corrected as shown below:

COLUMN 7:

Line 23, "turn" should read --term--.

COLUMN 9:

Line 49, "embodiment," should read --embodiment--.

Signed and Sealed this

Seventeenth Day of March, 1998

*Attest:*

BRUCE LEHMAN

*Attesting Officer*     *Commissioner of Patents and Trademarks*